(12) United States Patent
Hwang et al.

(10) Patent No.: US 9,151,544 B2
(45) Date of Patent: Oct. 6, 2015

(54) LIQUID-COOLING HEAT EXCHANGE MODULE

(75) Inventors: Jer-Sheng Hwang, Taoyuan (TW); Teng-Kai Chang, Taoyuan (TW)

(73) Assignee: ENERMAX TECHNOLOGY CORPORATION, Taoyuan County (TW)

( * ) Notice: Subject to any disclaimer, the term of this patent is extended or adjusted under 35 U.S.C. 154(b) by 389 days.

(21) Appl. No.: 13/562,978

(22) Filed: Jul. 31, 2012

(65) Prior Publication Data

US 2013/0105119 A1    May 2, 2013

(30) Foreign Application Priority Data

Oct. 27, 2011    (TW) .............................. 100220196 U

(51) Int. Cl.
| | | |
|---|---|---|
| F28F 3/02 | (2006.01) | |
| F28F 3/06 | (2006.01) | |
| F28F 3/12 | (2006.01) | |
| H01L 23/473 | (2006.01) | |
| H05K 7/20 | (2006.01) | |
| F28D 15/00 | (2006.01) | |
| F28F 3/08 | (2006.01) | |
| F28D 21/00 | (2006.01) | |

(52) U.S. Cl.
CPC ................ F28D 15/00 (2013.01); F28F 3/086 (2013.01); H01L 23/473 (2013.01); H05K 7/20254 (2013.01); F28D 2021/0028 (2013.01); H01L 2924/0002 (2013.01)

(58) Field of Classification Search
CPC ............... F28K 3/02; F28K 3/06; F28K 3/12; F28K 13/12; H01L 23/473; H05K 7/20; H05K 7/20254

USPC ......... 165/80.4, 104.19, 104.28, 104.33, 168, 165/170
See application file for complete search history.

(56) References Cited

U.S. PATENT DOCUMENTS

| | | | | |
|---|---|---|---|---|
| 2,888,584 | A * | 5/1959 | Hickey, Jr. ...................... 313/17 |
| 4,450,896 | A * | 5/1984 | Opitz et al. .................... 165/146 |
| 5,365,400 | A * | 11/1994 | Ashiwake et al. ............. 361/752 |
| 5,423,376 | A * | 6/1995 | Julien et al. ................... 165/80.4 |
| 7,007,506 | B2 * | 3/2006 | Kubo et al. ...................... 62/515 |
| 7,331,380 | B2 * | 2/2008 | Ghosh et al. ............. 165/104.33 |
| 7,537,047 | B2 * | 5/2009 | Lai et al. ....................... 165/80.4 |
| 7,549,460 | B2 * | 6/2009 | East et al. ...................... 165/80.4 |
| 7,597,135 | B2 * | 10/2009 | Ghosh et al. ................. 165/80.4 |
| 7,694,721 | B2 * | 4/2010 | Lai et al. ....................... 165/80.4 |
| 7,729,118 | B2 * | 6/2010 | Lai et al. ....................... 361/699 |
| 7,753,662 | B2 * | 7/2010 | Lai et al. ..................... 417/423.9 |
| 8,056,615 | B2 * | 11/2011 | Downing ..................... 165/80.4 |
| 2005/0077028 | A1 * | 4/2005 | Oikawa ........................ 165/80.4 |
| 2006/0266498 | A1 * | 11/2006 | Liu et al. ...................... 165/80.4 |
| 2012/0080166 | A1 * | 4/2012 | Cheng ............................. 165/67 |
| 2012/0181005 | A1 * | 7/2012 | Downing ..................... 165/166 |
| 2014/0319672 | A1 * | 10/2014 | Tsubokawa et al. .......... 257/712 |

* cited by examiner

*Primary Examiner* — Allen Flanigan
*Assistant Examiner* — For K Ling
(74) *Attorney, Agent, or Firm* — Chin-Ming Shih; HDLS IPR Services

(57) ABSTRACT

A liquid-cooling heat-dissipating module is configured for allowing a cooling liquid to be filled therein and includes a casing and a cooling assembly. The casing has a hollow interior and is provided with an inlet and an outlet in communication with its interior. The cooling assembly is provided in the casing and formed with a conical eddy generation region at a position corresponding to the outlet. The cooling liquid generates an eddy in the eddy generation region to flow into the outlet. By this structure, the staying time of the cooling liquid in the heat exchange module is increased, so that the cooling effect and the heat-dissipating efficiency of the cooling liquid are improved greatly.

7 Claims, 9 Drawing Sheets

LIQUID-COOLING HEAT EXCHANGE MODULE

BACKGROUND OF THE INVENTION

1. Field of the Invention

The present invention relates to a cooling system, and in particular to a liquid-cooling heat exchange module.

2. Description of Prior Art

With the rapid advancement of electronic industry, it is an important issue to dissipate the heat generated by high-performance heat-generating electronic elements. For this purpose, conventionally, various heat sinks are developed, in which the airflow convention generated by a heat-dissipating fan, a heat pipe, or a liquid-cooling heat-dissipating system is used for heat dissipation In the conventional liquid-cooling heat-dissipating system, a heat exchange module is provided to thermally contact the heat-generating element. A cooling liquid is filled into the heat exchange module to absorb the heat generated by the heat-generating element. Then, the cooling liquid after absorbing the heat flows into the heat exchange module to perform the heat dissipation. FIG. 1 shows the internal structure of a conventional heat exchange module 1a. The heat exchange module 1a has a casing 10a, and a cooling assembly 11a provided in the casing 10a. The casing 10a is provided with an inlet 100a and an outlet 101a opposite to each other. The cooling assembly 11a is formed with a plurality of slots 110a. The cooling liquid enters the heat exchange module 1a via the inlet 100a and flows through the slots 110a in the cooling assembly 11a to take away the heat. Finally, the cooling liquid exits the heat exchange module 1a via the outlet 101a.

For those skilled in the art, it is an important issue to increase the retention time of the cooling liquid in the heat exchange module. Thus, winding channels are often provided in the traditional heat exchange module, so that the retention time of the cooling liquid in the heat exchange module can be increased because the cooling liquid has to flow through the long winding channels. However, the length of the flowing channels is restricted by the dimension of the whole heat exchange module. Thus, it is a challenge for those skilled in the art to solve this problem.

Therefore, the present Inventor provides a novel and reasonable structure based on his expert knowledge and deliberate researches.

SUMMARY OF THE INVENTION

The present invention is to provide a liquid-cooling heat exchange module, which the cooling liquid can generate an eddy in the heat exchange module, thereby increasing the retention time of the cooling liquid in the heat exchange module.

The present invention is to provide a liquid-cooling heat exchange module which the cooling liquid flows through a longer channel to increase its retention time in the heat exchange module.

The present invention is to provide a liquid-cooling heat exchange module, configured to allow a cooling liquid to flow therein and including a casing and a cooling assembly. The casing has a hollow interior. The casing is provided with an inlet and an outlet in communication with the interior of the casing. The cooling assembly is disposed in the casing. The cooling assembly is formed with an eddy generation region at a position corresponding to the outlet. The cooling liquid generates an eddy in the eddy generation region to flow into the outlet.

DETAILED DESCRIPTION OF THE INVENTION

For better understanding the characteristics and technical contents of the present invention, a detailed description relating thereto will be made with reference to the accompanying drawings. However, the drawings are illustrative only, but not used to limit the scope of the present invention.

Figure 1:
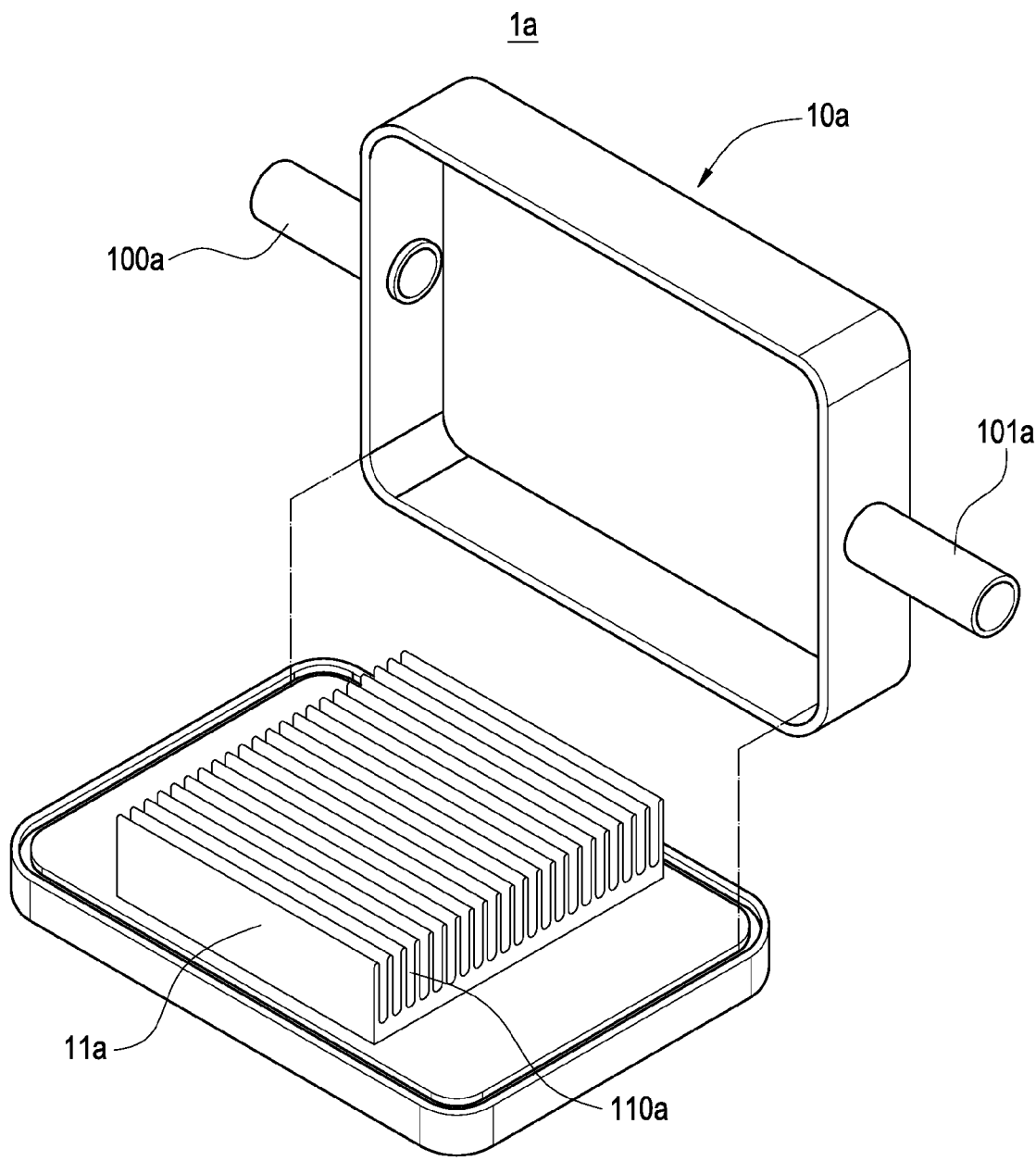
FIG. 1 is a schematic view showing the internal structure of the conventional heat exchange module.
Figure 2:
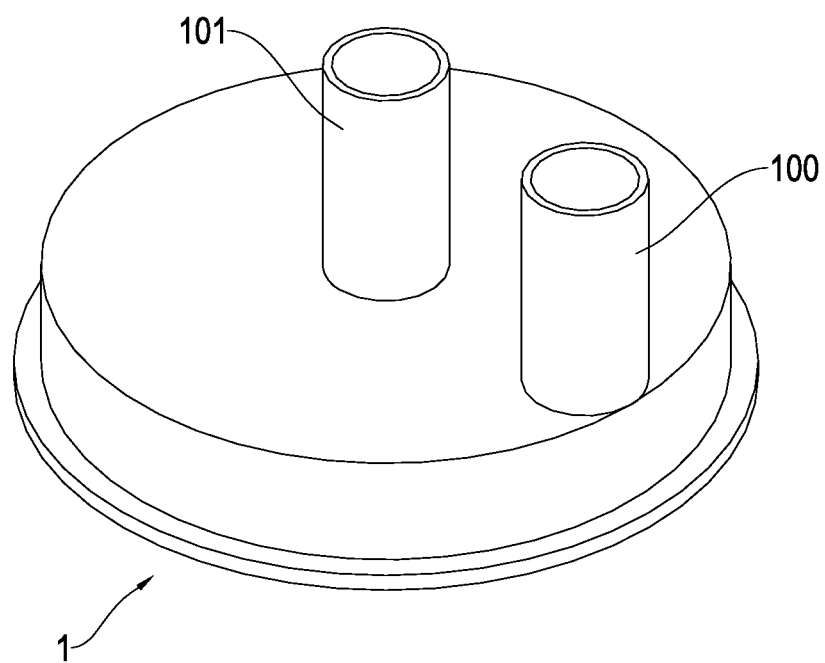
FIG. 2 is a schematic view showing the external appearance of the present invention.
Figure 3:
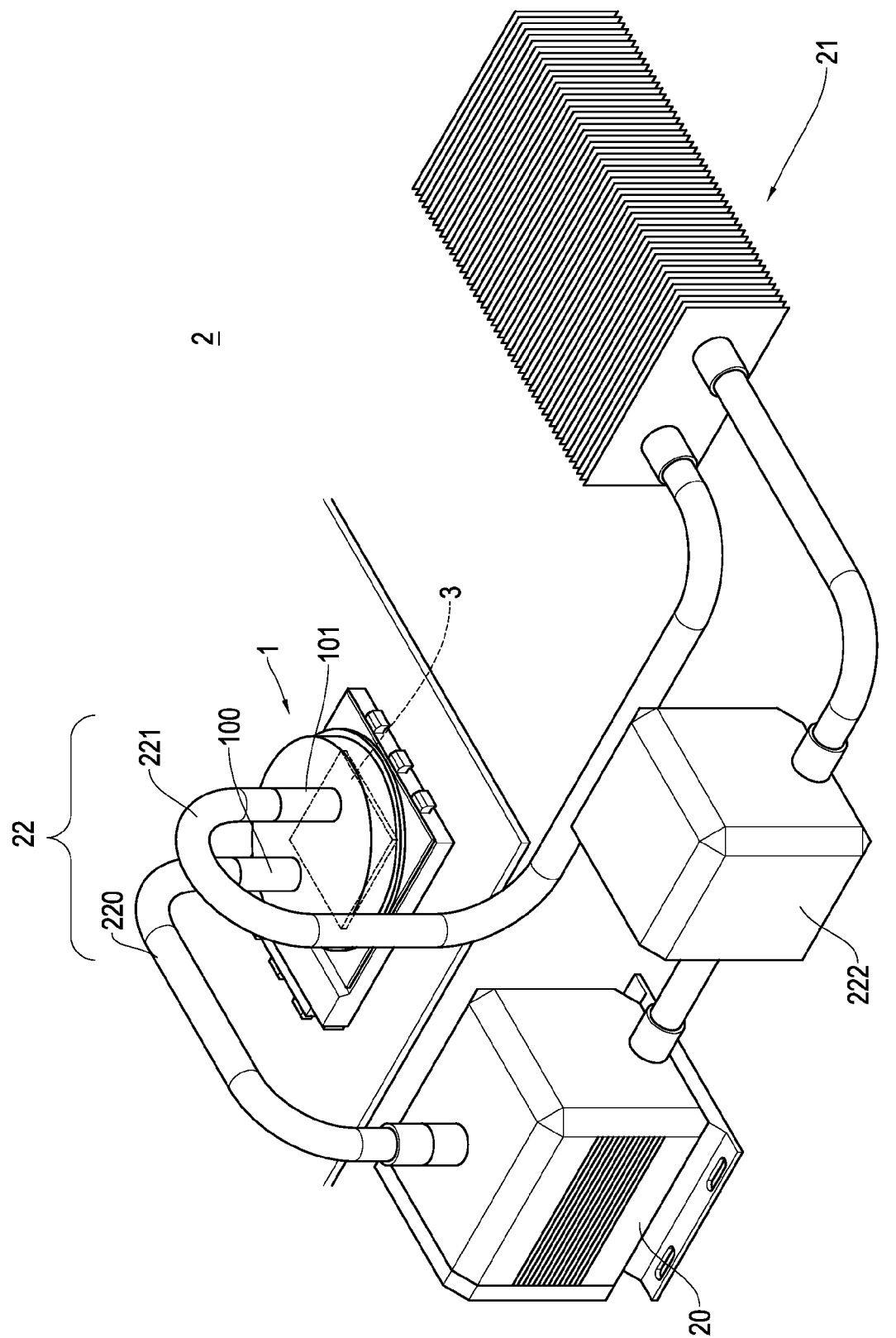
FIG. 3 is a schematic view showing the application of the present invention in a liquid-cooling heat-dissipating system.

Please refer to FIGS. 2 and 3. FIG. 2 is a schematic view showing the external appearance of the present invention, and FIG. 3 is a schematic view showing the application of the present invention in a liquid-cooling heat-dissipating system. The present invention provides a liquid-cooling heat exchange module 1, which is installed in a liquid-cooling heat-dissipating system 2 for cooling or dissipating the heat generated by a heat-generating element 3. The liquid-cooling heat-dissipating system 2 further includes a pump 20, a heat sink 21, and a delivering loop 22 serially connected the pump 20 and the heat sink 21. The delivering loop 22 includes an input pipe 220 and an output pipe 221. The delivering loop 22 is connected to a tank 222 for containing a cooling liquid (not shown). The pump 20 pumps the cooling liquid from the tank 222 into the heat exchange module 1. The cooling liquid absorbs the heat generated by the heat-generating element 3, thereby dissipating the heat of the heat-generating element 3 to achieve a cooling effect. The cooling liquid after absorbing the heat is delivered to the heat sink 21 via the output pipe 221. The heat sink 21 dissipates the heat contained in the cooling liquid to lower the temperature of the cooling liquid. Then, the pump 20 pumps the cooling liquid flowing through the heat sink 21 to flow back into the tank 222 for circulation in the heat exchange module 1.

Figure 4:
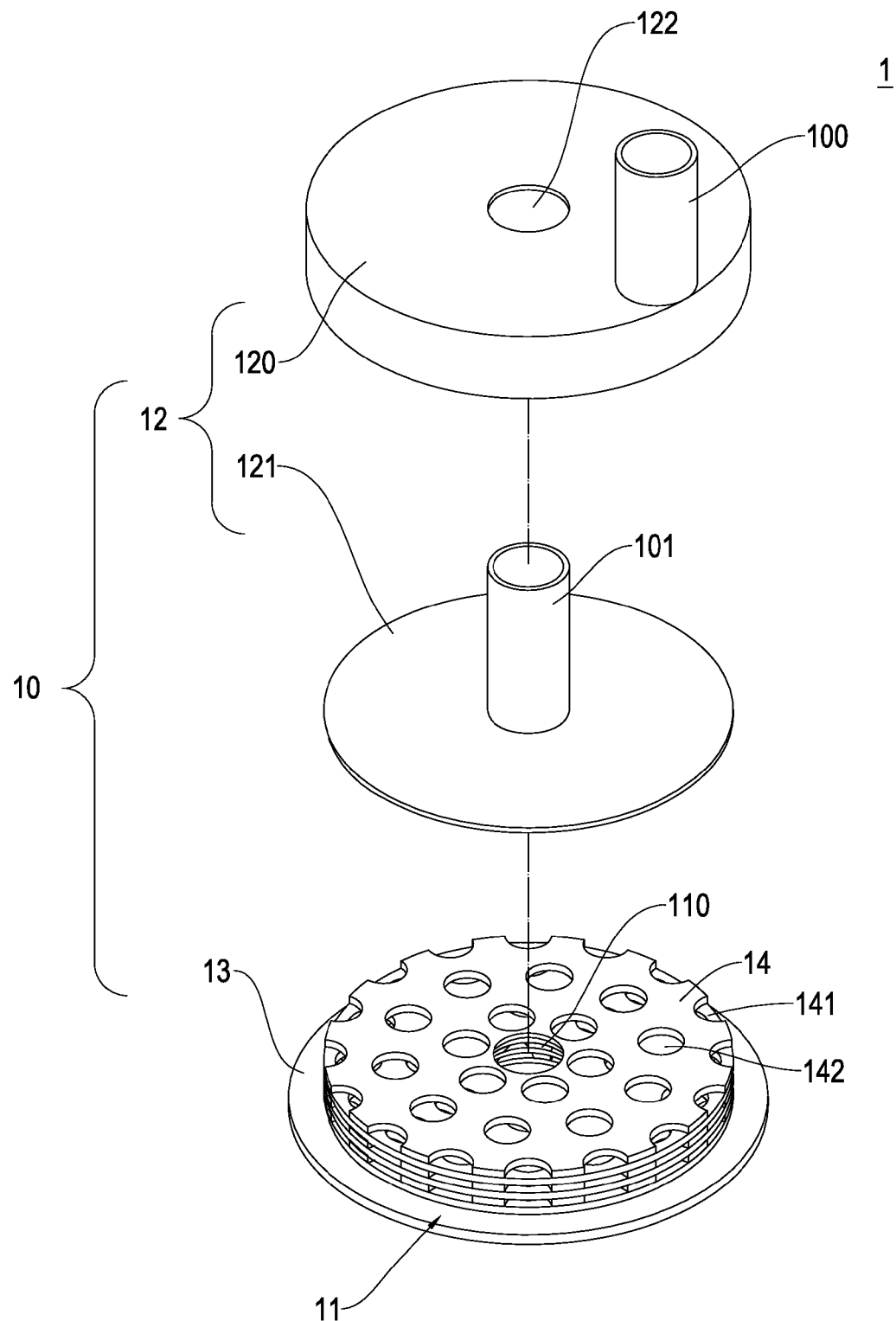
FIG. 4 is an exploded perspective view showing a first embodiment of the present invention.

Please refer to FIG. 4. The heat exchange module 1 includes a hollow casing 10, and a cooling assembly 11 disposed in the casing 10. The casing 10 is provided with an inlet 100 and an outlet 101. The inlet 100 and the outlet 101 are in communication with the interior of the casing 10. The inlet 100 and the outlet 101 are connected to the input pipe 220 and the output pipe 221 respectively, so that the cooling liquid can be filled into the casing 10 via the inlet 100 and exits via the outlet 101. In the present embodiment, both of the inlet 100 and the outlet 101 are formed with a connecting pipe respectively. The casing 10 comprises an upper cover 12 and a base 13. The cooling assembly 11 is disposed on the base 13. The upper cover 12 further comprises an outer shroud 120 and an inner partition 121 provided in the outer shroud 120. The inlet 100 is provided on the outer shroud 120, and the outlet 101 is provided on the inner partition 121. The outer shroud 120 is provided with a through-hole 122 at a position corresponding to the outlet 101. The connecting pipe formed on the outlet 101 penetrates the through-hole 122 after the upper cover 12 and the base 13 are assembled together.

Figure 5:
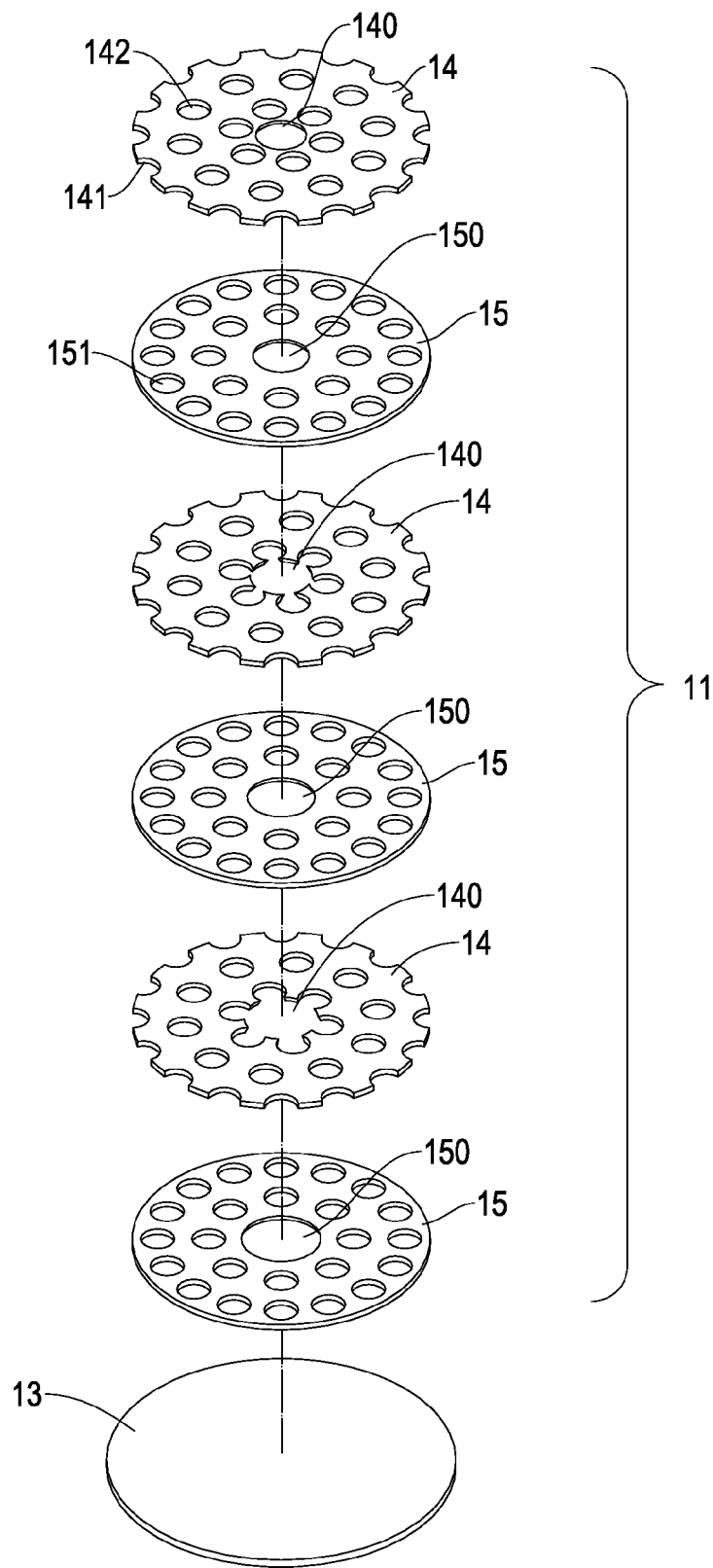
FIG. 5 is an exploded view showing the cooling assembly according to the first embodiment of the present invention.

According to the above, the present invention is characterized in that: the cooling assembly 11 is formed with a conical eddy generation region 110 at a position corresponding to the outlet 101 of the casing 10. Before the cooling liquid flows through the outlet 101 into the output pipe 221, the cooling liquid first passes through the eddy generation region 110 to generate an eddy in the eddy generation region 110. In this way, the retention time of the cooling liquid in the cooling assembly 11 is extended, so that the heat-dissipating effect of the cooling liquid can be employed more efficiency. Please also refer to FIG. 5. In the present embodiment, the cooling assembly 11 is formed by overlapping a plurality of first fins 14 and second fins 15 in an alternating manner. The center of each first fin 14 is provided with an eddy hole 140, and the center of each second fin 15 is provided with an eddy hole 150. The diameters of the eddy holes 140 and 150 are gradually changed in sequence. More specifically, the eddy hole 140 closer to the outlet 101 has a smaller diameter. The eddy hole 150 away from the outlet 101 has a larger diameter. By this arrangement, the eddy generation region 110 is formed. The outer edge of each first fin 14 is circumferentially provided with a plurality of notches 141. Each first fin 14 is provided with a plurality of via holes 142 surrounding the eddy hole 140, and each second fin 15 is provided with a plurality of via holes 151 surrounding the eddy hole 150. The via holes 142 of the first fins 14 and the via holes 151 of the second fins 15 are arranged in a plurality of circles depending on the dimensions of the first fin 14 and second fin 15. The notches 141 of the first fins 14 are arranged adjacent to the via holes 151 of the second fins 15 in an alternating and misaligned manner. The via holes 151 of the second fins 15 are arranged adjacent to the via holes 142 of the first fins 14 in an alternating and misaligned manner. By this arrangement, the cooling liquid flows through the adjacent portions formed between the notches 141 and the via holes 151 as well as between the via holes 151 and the via holes 142, and finally flows through the eddy holes 140 and 150. Thus, it can be understand that the cooling liquid has to flow through winding channels before it enters the eddy generation region 110.

By this structure, the liquid-cooling heat-dissipating module of the present invention can be obtained.

Figure 6:
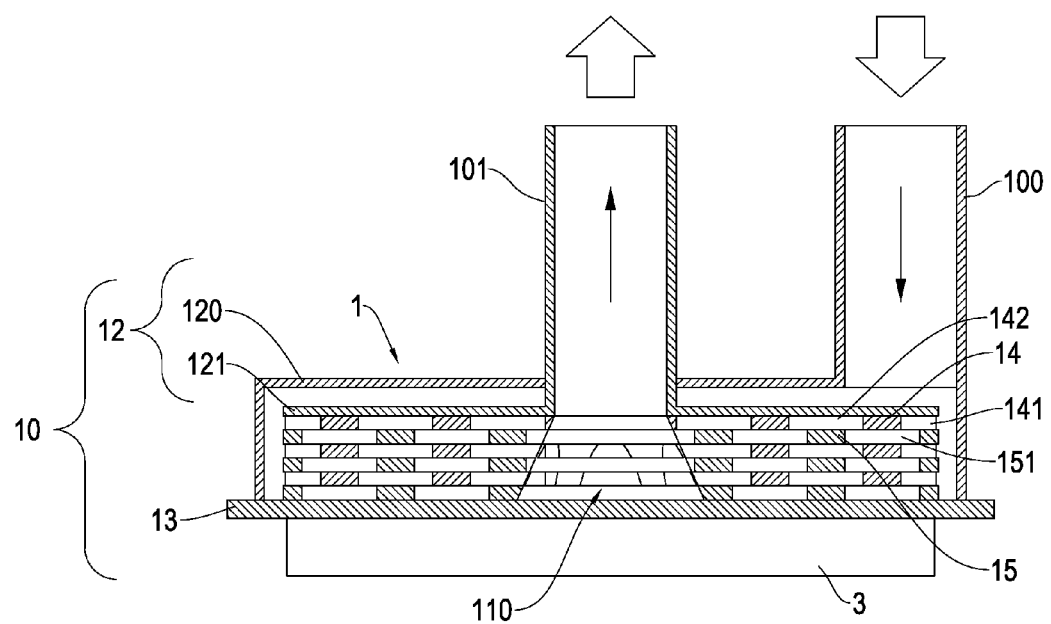
FIG. 6 is a schematic view showing the internal structure according to the first embodiment of the present invention.

Please also refer to FIGS. 2 and 6. When the pump 20 pumps the cooling liquid contained in the tank 222 through the input pipe 220 into the heat exchange module 1 via the inlet 100, the cooling liquid first flows into the heat exchange module 1 through the notches 141 of the first fins 14 of the cooling assembly 11, and the retention time of the cooling liquid can be increased by forcing the cooling liquid flowing through the winding channels formed by the via holes 142 of the first fins 14 and the via holes 151 of the second fins 15. By this arrangement, the retention time of the cooling liquid in the cooling assembly 11 is increased. Finally, since the cooling liquid flows into the eddy holes 140 of the first fins 14 and the eddy holes 150 of the second fins 15, that is, the cooling liquid flows toward the eddy generation region 110 of the cooling assembly 11. Further, the eddy generation region 110 is connected to the outlet 101, so that the cooling liquid will rotate to generate an eddy by flowing along the conical shape of the eddy generation region 110, thereby increasing the retention time of the cooling liquid in the cooling assembly 11. In this way, the cooling liquid has sufficient time to absorb the heat generated by the heat-generating element 3 because the longer retention time of the cooling liquid certainly increases the heat exchange and cooling effect. Thus, the heat exchange module of the present invention has an improved heat-dissipating effect on the heat-generating element 3.

Figure 7:
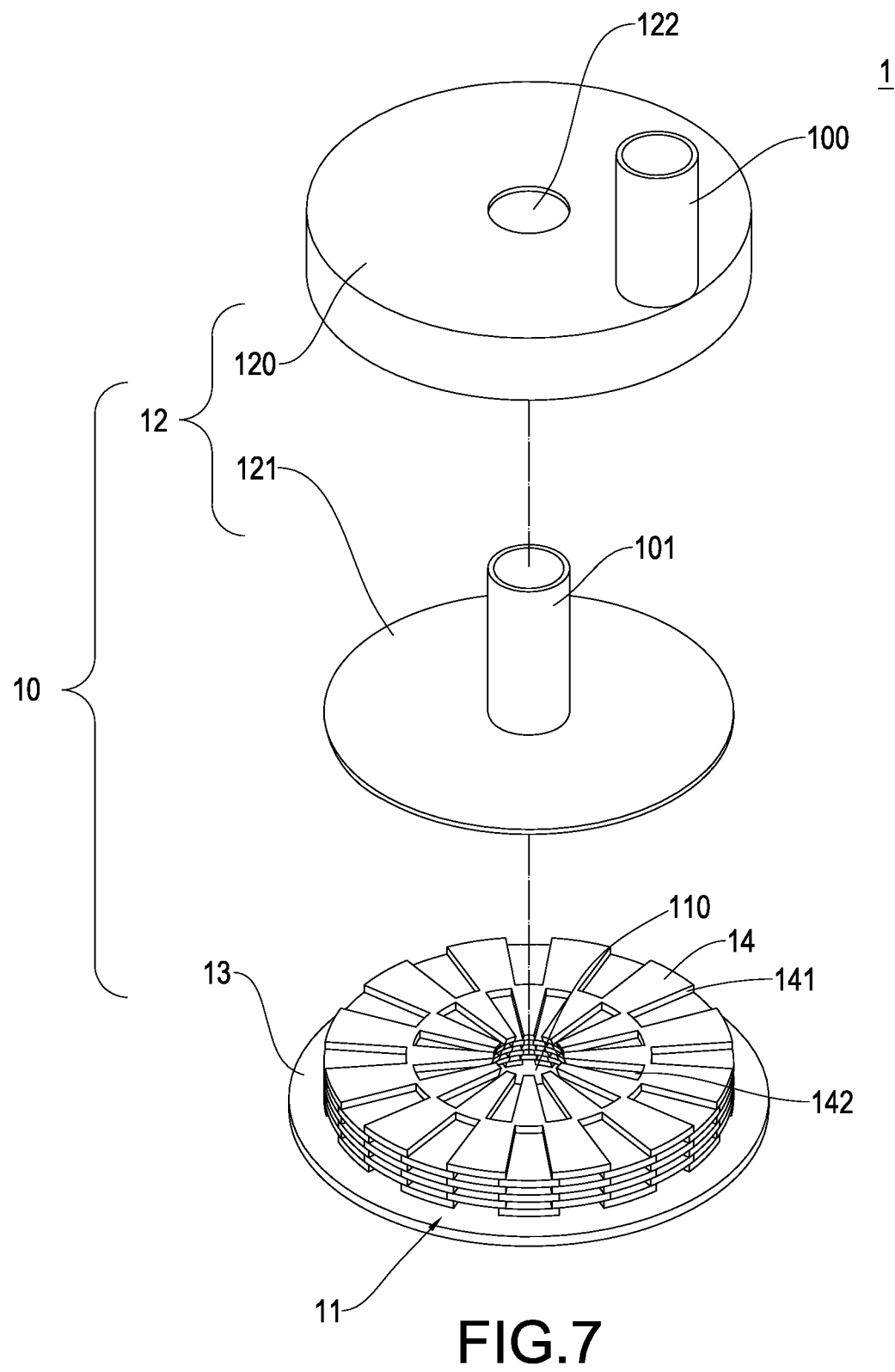
FIG. 7 is an exploded perspective view showing a second embodiment of the present invention.
Figure 8:
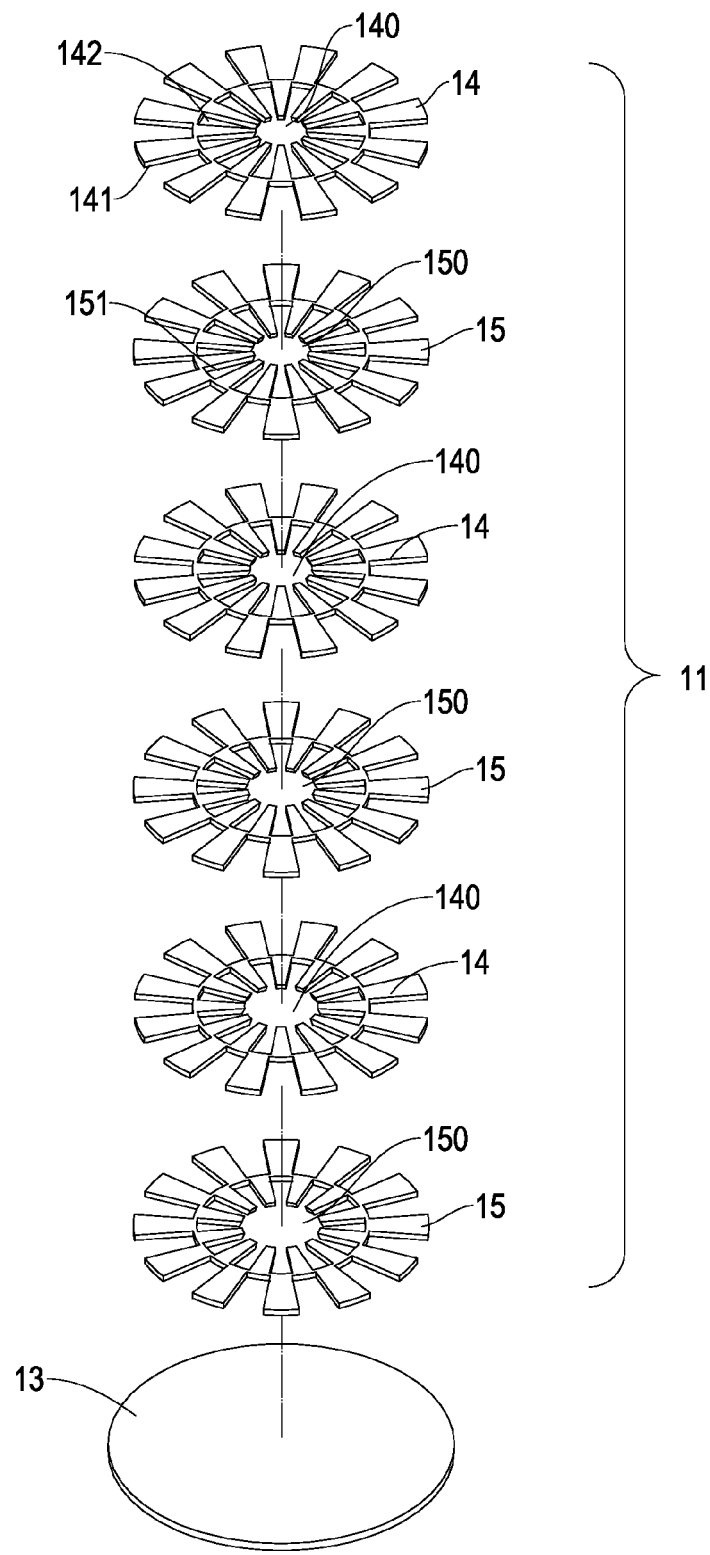
FIG. 8 is an exploded view showing the cooling assembly according to the second embodiment of the present invention.
Figure 9:
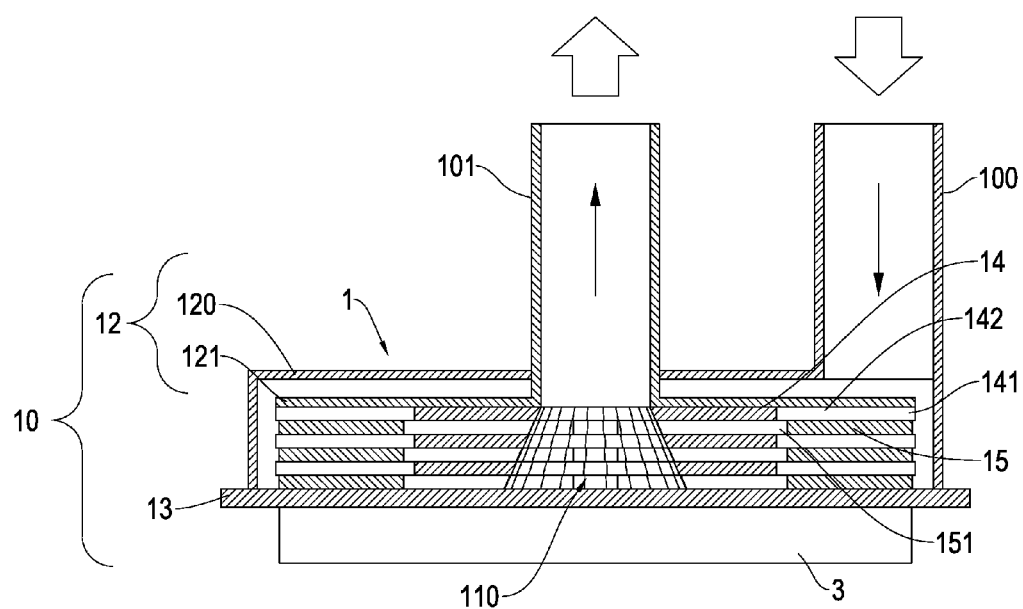
FIG. 9 is a schematic view showing the internal structure when in use according to the second embodiment of the present invention.

Please refer to FIGS. 7 to 9, which show the second embodiment of the present invention. The shape of the via holes 142 of the first fins 14 and the via holes 151 of the second fins 15 of the cooling assembly 11 is the same. The adjacent first fins 14 and the second fins 15 are arranged in an alternating and misaligned manner, so that the via holes 142 and 151 kept in communication with each other, thereby forming winding channels in the cooling assembly 11 like the first embodiment.

According to the present invention, the present invention really achieves the desired objects and solves the problems in prior art. Further, the present invention demonstrates novelty and inventive steps, which conforms to the requirements for an invention patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A liquid-cooling heat-dissipating module, configured for allowing a cooling liquid to be filled therein and including:
   a casing, having a hollow interior and provided with an inlet and an outlet in communication with its interior; and
   a cooling assembly including a plurality of first fins and a plurality of second fins, provided in the casing for dissipating heat, the plurality of the first fins and the plurality of the second fins being formed with a conical eddy generation region at a position corresponding to the outlet, the cooling liquid generating an eddy in the eddy generation region to flow into the outlet,
   wherein the plurality of the first fins and the plurality of the second fins have same diameters and different shapes, and the plurality of the first fins and the plurality of the second fins stack in an alternating manner, and each of the plurality of the first fins and the plurality of the second fins are provided with an eddy hole to form the eddy generation region,
   wherein the plurality of the first fins and the plurality of the second fins have a plurality of via holes, and the eddy hole of each of the first fins gradually enlarges toward a direction away from the outlet so as to gradually interconnect with adjacent via holes in each of the first fins;
   wherein the casing comprises an upper cover and a base, and the cooling assembly is provided on the base;
   wherein the upper cover comprises an outer shroud, and an inner partition provided in the outer shroud, the inlet is provided on the outer shroud, the outlet is provided on the inner partition, and the cooling assembly is further provided in the inner partition.

2. The liquid-cooling heat-dissipating module according to claim 1, wherein the outer shroud is provided with a through-hole at a position corresponding to the outlet, and the outlet is provided with a connecting pipe to penetrate the through-hole.

3. The liquid-cooling heat-dissipating module according to claim 1, wherein the eddy holes are located in central positions of the first fins and the second fins respectively.

4. The liquid-cooling heat-dissipating module according to claim 1, wherein the eddy holes of the first fins and the second fins are overlapped in sequence.

5. The liquid-cooling heat-dissipating module according to claim 1, wherein the first fins and the second fins are arranged in an alternating and misaligned manner, so that the adjacent via holes are in communication with each other and further in communication with the eddy holes of the first fins and the second fins.

6. A liquid-cooling heat-dissipating module, configured for allowing a cooling liquid to be filled therein and including:
   a casing, having a hollow interior and provided with an inlet and an outlet in communication with its interior; and
   a cooling assembly including a plurality of first fins and a plurality of second fins, provided in the casing for dissipating heat, the plurality of the first fins and the plurality of the second fins being formed with a conical eddy generation region at a position corresponding to the outlet, the cooling liquid generating an eddy in the eddy generation region to flow into the outlet,
   wherein the plurality of the first fins and the plurality of the second fins have same diameters and different shapes, and the plurality of the first fins and the plurality of the second fins stack in an alternating manner, and each of the plurality of the first fins and the plurality of the second fins are provided with an eddy hole to form the eddy generation region,
   wherein the plurality of the first fins and the plurality of the second fins have a plurality of via holes, and the eddy hole of each of the first fins gradually enlarges toward a direction away from the outlet so as to gradually interconnect with adjacent via holes in each of the first fins;
   wherein an outer edge of each first fin is circumferentially provided with a plurality of notches, each of the first fins and the second fins is provided with a plurality of via holes surrounding its eddy hole, the notch of each first fin is misaligned with and adjacent to the via hole of each second fin, the via hole of each second fin is misaligned with and adjacent to the via hole of each first fin, so that the adjacent via holes are in communication with each other and further in communication with the eddy holes of the first fins and the second fins.

7. The liquid-cooling heat-dissipating module according to claim 6, wherein the via holes of the first fins and the second fins are arranged in a plurality of circles.

* * * * *